(12) United States Patent
Vittu (10) Patent No.: US 8,372,694 B2
(45) Date of Patent: Feb. 12, 2013

(54) SEMICONDUCTOR PACKAGE FABRICATION PROCESS AND SEMICONDUCTOR PACKAGE

(75) Inventor: Julien Vittu, Villard de Lans (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 492 days.

(21) Appl. No.: 12/685,457

(22) Filed: Jan. 11, 2010

(65) Prior Publication Data
US 2010/0244229 A1    Sep. 30, 2010

(30) Foreign Application Priority Data
Mar. 31, 2009   (FR) ...................................... 09 52029

(51) Int. Cl.
*H01L 21/78* (2006.01)
(52) U.S. Cl. .. 438/113; 438/119; 438/464; 257/E21.599
(58) Field of Classification Search .................. 438/113, 438/114, 118, 119, 464
See application file for complete search history.

(56) References Cited

U.S. PATENT DOCUMENTS

| | | | | |
|---|---|---|---|---|
| 5,641,996 | A * | 6/1997 | Omoya et al. ................. | 257/787 |
| 5,661,042 | A * | 8/1997 | Fang et al. ...................... | 438/17 |
| 5,677,576 | A * | 10/1997 | Akagawa ....................... | 257/785 |
| 5,686,703 | A * | 11/1997 | Yamaguchi ................... | 174/259 |
| 5,783,465 | A * | 7/1998 | Canning et al. ............... | 438/119 |
| 5,918,113 | A * | 6/1999 | Higashi et al. ................ | 438/119 |
| 6,049,038 | A * | 4/2000 | Suzuki .......................... | 174/539 |
| 6,087,202 | A * | 7/2000 | Exposito et al. .............. | 438/113 |
| 6,103,553 | A * | 8/2000 | Park .............................. | 438/119 |
| 6,111,324 | A | 8/2000 | Sheppard et al. | |
| 6,130,473 | A * | 10/2000 | Mostafazadeh et al. ....... | 257/666 |
| 6,204,564 | B1 * | 3/2001 | Miyata et al. ................. | 257/778 |
| 6,311,888 | B1 * | 11/2001 | Funada et al. ................ | 228/106 |
| 6,346,750 | B1 * | 2/2002 | Jiang et al. .................... | 257/783 |
| 6,399,426 | B1 * | 6/2002 | Capote et al. ................. | 438/127 |
| 6,414,397 | B1 * | 7/2002 | Sawamoto .................... | 257/783 |
| 6,426,566 | B1 * | 7/2002 | Sawamoto .................... | 257/783 |
| 6,429,453 | B1 * | 8/2002 | Park .............................. | 257/48 |
| 6,461,890 | B1 * | 10/2002 | Shibata ......................... | 438/106 |

(Continued)

FOREIGN PATENT DOCUMENTS

| EP | 1 548 937 | 6/2005 |
|---|---|---|
| WO | WO 2008/038345 | 4/2008 |

OTHER PUBLICATIONS

Preliminary French Search Report, FR 0952029, Jul. 21, 2009, 2 pages.

*Primary Examiner* — David Vu
*Assistant Examiner* — Earl Taylor
(74) *Attorney, Agent, or Firm* — Gardere Wynne Sewell LLP (57) ABSTRACT

A substrate is provided with electrical connection pads on a front face and on a rear face, the front pads and rear pads being selectively connected via a network passing through the substrate. A peripheral edge of the substrate is mounted on a rigid annular frame and the rearm face secured to a suction table. A layer of a dielectric sealant containing electrically conductive particles is deposited on the front face and front pads of the substrate. Integrated-circuit chips are positioned on the front face to flatten the layer of dielectric sealant, the included electrically conductive particles making electrical connection between pads of the integrated-circuit and the front pads of the substrate. The resulting assembly in then encapsulated in a block of encapsulating material positioned on top of the front face of the substrate. The block is then diced in order to obtain a plurality of semiconductor packages.

17 Claims, 7 Drawing Sheets

U.S. PATENT DOCUMENTS

| | | | | |
|---|---|---|---|---|
| 6,472,726 B1 * | 10/2002 | Hashimoto | | 257/668 |
| 6,492,738 B2 * | 12/2002 | Akram et al. | | 257/783 |
| 6,514,796 B2 * | 2/2003 | Usami et al. | | 438/118 |
| 6,518,097 B1 * | 2/2003 | Yim et al. | | 438/119 |
| 6,518,677 B1 * | 2/2003 | Capote et al. | | 257/783 |
| 6,566,234 B1 * | 5/2003 | Capote et al. | | 438/458 |
| 6,620,652 B1 * | 9/2003 | Shibata | | 438/119 |
| 6,723,583 B2 * | 4/2004 | Takahashi et al. | | 438/114 |
| 6,737,300 B2 * | 5/2004 | Ding et al. | | 438/110 |
| 6,774,493 B2 * | 8/2004 | Capote et al. | | 257/778 |
| 6,798,072 B2 * | 9/2004 | Kajiwara et al. | | 257/778 |
| 6,888,228 B1 * | 5/2005 | Mostafazadeh et al. | | 257/666 |
| 6,900,550 B2 * | 5/2005 | Yamazaki et al. | | 257/783 |
| 6,903,463 B1 * | 6/2005 | Takeichi et al. | | 257/778 |
| 6,911,720 B2 * | 6/2005 | Yamazaki et al. | | 257/678 |
| 6,926,796 B1 * | 8/2005 | Nishida et al. | | 156/312 |
| 6,977,024 B2 * | 12/2005 | Yamazaki et al. | | 156/235 |
| 6,981,317 B1 * | 1/2006 | Nishida | | 29/840 |
| 6,982,492 B2 * | 1/2006 | Rumer et al. | | 257/783 |
| 7,081,675 B2 * | 7/2006 | Yim et al. | | 257/753 |
| 7,141,873 B2 * | 11/2006 | Aoyagi | | 257/686 |
| 7,198,984 B2 * | 4/2007 | Hasimoto | | 438/108 |
| 7,241,643 B1 * | 7/2007 | Kelkar et al. | | 438/113 |
| RE39,854 E * | 9/2007 | Mostafazadeh et al. | | 257/666 |
| 7,303,942 B2 * | 12/2007 | Kuwabara et al. | | 438/113 |
| 7,332,371 B2 * | 2/2008 | Hashimoto | | 438/108 |
| 7,564,139 B2 * | 7/2009 | Kuwabara et al. | | 257/778 |
| 7,576,436 B2 * | 8/2009 | Hung | | 257/778 |
| 7,632,719 B2 * | 12/2009 | Choi et al. | | 438/123 |
| 7,683,482 B2 * | 3/2010 | Nishida et al. | | 257/737 |
| 7,696,014 B2 * | 4/2010 | Kitahara et al. | | 438/118 |
| 7,741,150 B2 * | 6/2010 | Leow et al. | | 438/107 |
| 7,833,837 B2 * | 11/2010 | Yang et al. | | 438/119 |
| 7,927,927 B2 * | 4/2011 | Quan et al. | | 438/137 |
| 7,935,574 B2 * | 5/2011 | Saiki et al. | | 438/113 |
| 7,994,026 B2 * | 8/2011 | Harikai et al. | | 438/464 |
| 8,007,627 B2 * | 8/2011 | Nishida et al. | | 156/306.6 |
| 2002/0053452 A1 * | 5/2002 | Quan et al. | | 174/52.1 |
| 2002/0056906 A1 * | 5/2002 | Kajiwara et al. | | 257/697 |
| 2002/0098620 A1 * | 7/2002 | Ding et al. | | 438/113 |
| 2002/0142518 A1 * | 10/2002 | Ding et al. | | 438/108 |
| 2003/0205797 A1 * | 11/2003 | Takahashi et al. | | 257/678 |
| 2005/0087891 A1 * | 4/2005 | Rumer et al. | | 257/789 |
| 2006/0170096 A1 * | 8/2006 | Yang et al. | | 257/723 |
| 2007/0013067 A1 * | 1/2007 | Nishida et al. | | 257/737 |
| 2008/0032452 A1 * | 2/2008 | Yang et al. | | 438/113 |
| 2010/0244229 A1 * | 9/2010 | Vittu | | 257/692 |
| 2011/0134612 A1 * | 6/2011 | Vittu | | 361/728 |

* cited by examiner

SEMICONDUCTOR PACKAGE FABRICATION PROCESS AND SEMICONDUCTOR PACKAGE

PRIORITY CLAIM

This application claims priority from French Application for Patent No. 0952029 filed Mar. 31, 2009, the disclosure of which is hereby incorporated by reference.

TECHNICAL FIELD

The present invention relates to the field of semiconductor packages comprising integrated-circuit chips.

BACKGROUND

A semiconductor package fabrication process, as described in U.S. Pat. No. 6,087,202 (the disclosure of which is hereby incorporated by reference), comprises bonding chips on a front face of a rigid electrical connection substrate, connecting the chips to the front face of the substrate via electrical connection wires, injection-over molding of blocks of encapsulation material on the front face of the substrate by embedding small numbers of chips per block and the corresponding electrical connection wires, and dicing the assembly thus formed in order to singulate semiconductor packages.

SUMMARY

In an embodiment, a process for fabricating semiconductor packages, including at least one integrated-circuit chip having electrical connection pads on one face, comprises: fabrication of a substrate provided with a plurality of electrical connection means comprising, in a plurality of front locations on its front face and in a plurality of rear locations on its rear face, corresponding to each other in the thickness direction of the substrate, front pads and rear pads respectively, these being selectively connected via an electrical connection network that passes through said substrate; mounting the peripheral edge of the substrate on a rigid annular frame; deposition, on at least said front pads of the substrate, of a layer of a dielectric sealant containing particles made of an electrically conductive material; positioning of integrated-circuit chips on said front locations respectively, flattening the sealing layer, and in positions such that the pads of these chips are selectively connected electrically to the front pads of the corresponding front locations of the substrate by means of particles of the sealing layer lying therebetween; encapsulation of the chips in a block of encapsulating material on top of the front face of the substrate so as to constitute a mounted assembly; and dicing of this mounted assembly, in the thickness direction of the substrate, in order to obtain a plurality of semiconductor packages each comprising a portion of the substrate, at least one integrated-circuit chip and a portion of said block encapsulating this at least one integrated-circuit chip.

The substrate may comprise a flexible sheet provided with said plurality of electrical connection means, the periphery of this sheet being fastened to an annular frame, the sealing layer deposition, chip positioning, encapsulation and dicing operations all being carried out with the rear face of the substrate placed on a suction table.

The sealing layer may be fabricated by lamination or by screen printing on the front face of the substrate.

The encapsulation may be carried out by compression molding, immersing the chips mounted on the substrate in a chamber of a mold containing a curable encapsulation material until this material encounters the front face of the substrate and/or the sealing layer.

Said assembly may be diced by sawing.

Also proposed is a semiconductor package comprising: a substrate having a front face and a rear face and including a sheet provided with electrical connection means comprising front pads and rear pads that are selectively connected via an electrical connection network passing through the substrate; at least one integrated-circuit chip having a face which is fastened to the front face of the substrate by means of a layer of a dielectric sealant and which includes electrical connection pads placed selectively above the front pads of the substrate, the pads of the chip and the front pads of the substrate being electrically connected via particles of an electrically conductive material that are contained in the sealant; and encapsulation of this integrated-circuit chip in front of the front face of the substrate.

BRIEF DESCRIPTION OF THE DRAWINGS

One method of fabricating a semiconductor package and one embodiment of a semiconductor package will now be described by way of non-limiting examples and illustrated by the drawings in which.

DETAILED DESCRIPTION OF THE DRAWINGS

Figure 1:
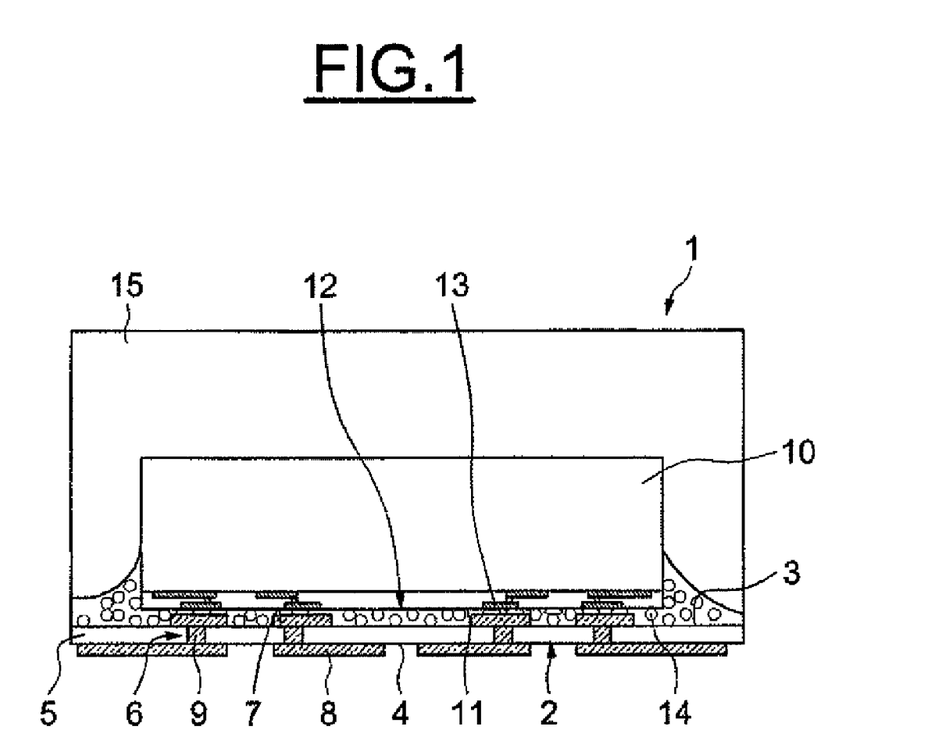
FIG. 1 shows a cross section through a semiconductor package.

FIG. 1 illustrates a semiconductor package 1 comprising a substrate 2, for example a square or rectangular substrate, which has a front face 3 and a rear face 4 and includes a thin sheet 5 provided with electrical connection means 6 comprising front pads 7 on the front face 3 and rear pads 8 on the rear face 4, these pads being selectively connected via a network 9 passing through the film 5.

The semiconductor package 1 includes an integrated-circuit chip 10 having a face 11 which is fastened to the front face 3 of the substrate 2 via a layer 12 of a dielectric sealant and which includes electrical connection pads 13 placed selectively above the front pads 7 of the substrate 2 and connected to the internal integrated circuits of the chip 10.

The front pads 7 of the substrate 2 and the pads 13 of the chip 10 are electrically connected via particles 14 of an electrically conductive material, which are contained in and distributed within the sealant and held or jammed between these pads. The density of the conductive particles 14 in the layer 12 is such that the pads 7 on one side and the pads 13 on the other side cannot be electrically connected by particles 14 other than at desired locations.

The semiconductor package 1 further includes an encapsulation 15 of the integrated-circuit chip 10 in front of the front face 3 of the substrate 2.

The encapsulation 15 may be of parallelepipedal shape and cover the chip 10 and the sidewalls of the latter, extending down to the edges of the substrate 2.

The sealing layer 12 may completely or partly cover the front face 3 of the substrate 2 and may completely or partly fill the space separating the front face 3 from the face 11 of the chip 10. Under these conditions, the encapsulation 15 may cover, around the chip 10, the periphery of the front face 3 of the substrate 2 and/or the sealing layer 12, and possibly penetrate beneath the chip 10.

The semiconductor package 1 may result from wafer-scale fabrication, which will now be described.

Figure 2:
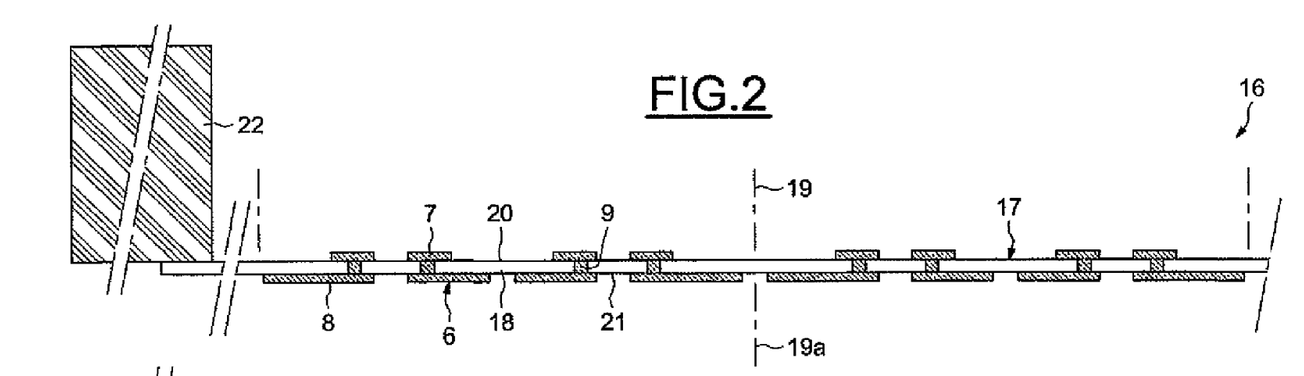
FIG. 2 shows a cross section through a device during a fabrication step.
Figure 7:
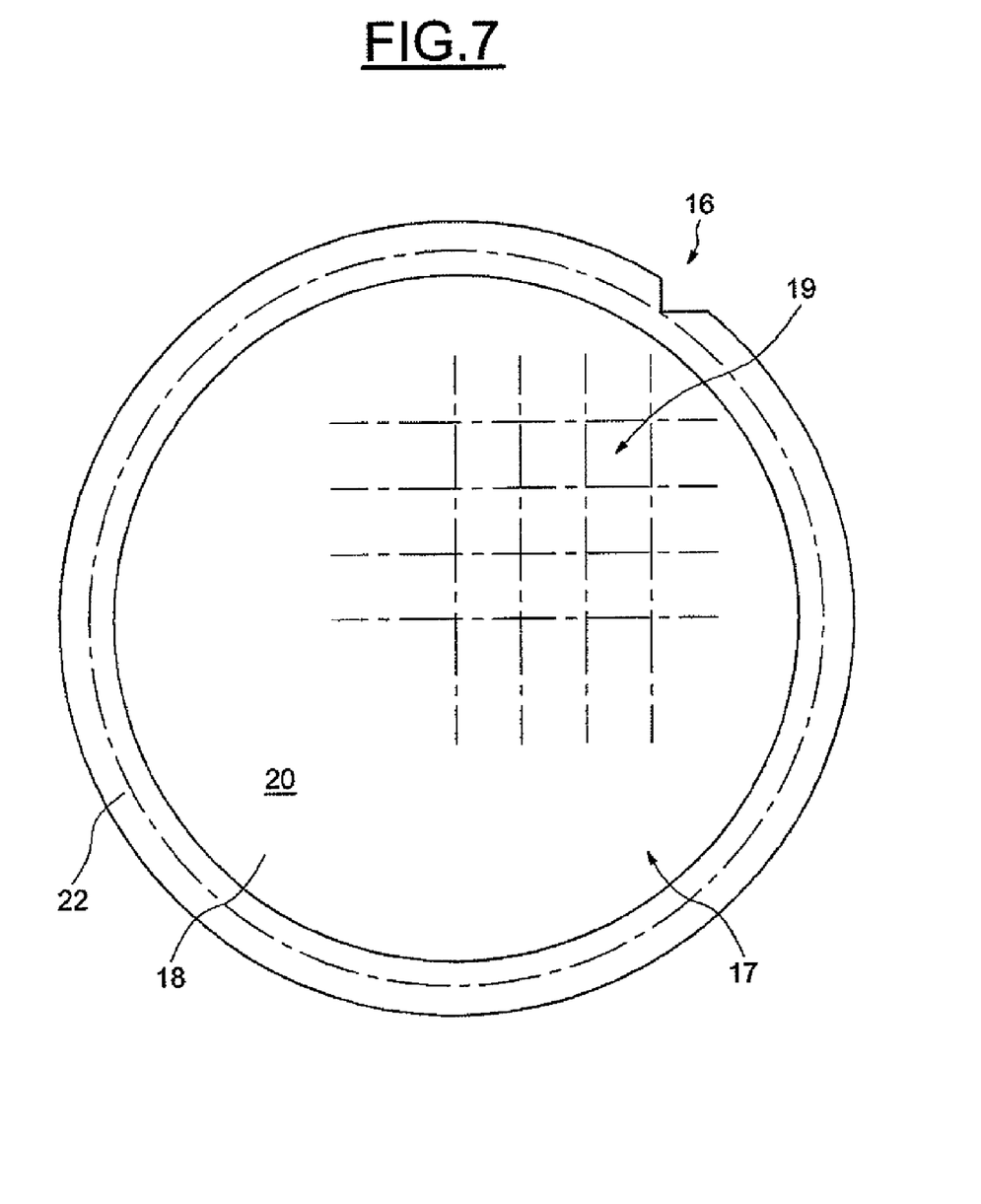
FIG. 7 shows a top view of the device of FIG. 2.

FIGS. 2 and 7 illustrate a device 16 comprising a large substrate 17 formed by a large dielectric sheet 18, which is thin and flexible, comprising a monolayer or of multilayers, which has, in a plurality of front locations 19, for example square or rectangular locations, adjacent and distributed in a matrix, a plurality of respective electrical connection means 6 for the semiconductor packages 1 to be obtained, their front pads 7 being formed on a front face 20 of the sheet 18. A rear face 21 of the sheet 18 has a plurality of rear locations 19a, corresponding to the front locations 19 in the thickness direction of the sheet 18, the rear pads 8 being formed in the rear locations 19a.

The peripheral edge of the sheet 18, for example a circular edge, is fastened to a rigid circular metal frame 22 by any known means, within which frame this sheet is held stretched, the locations 19 being situated away from the inner edge of the frame 22.

Figure 3:
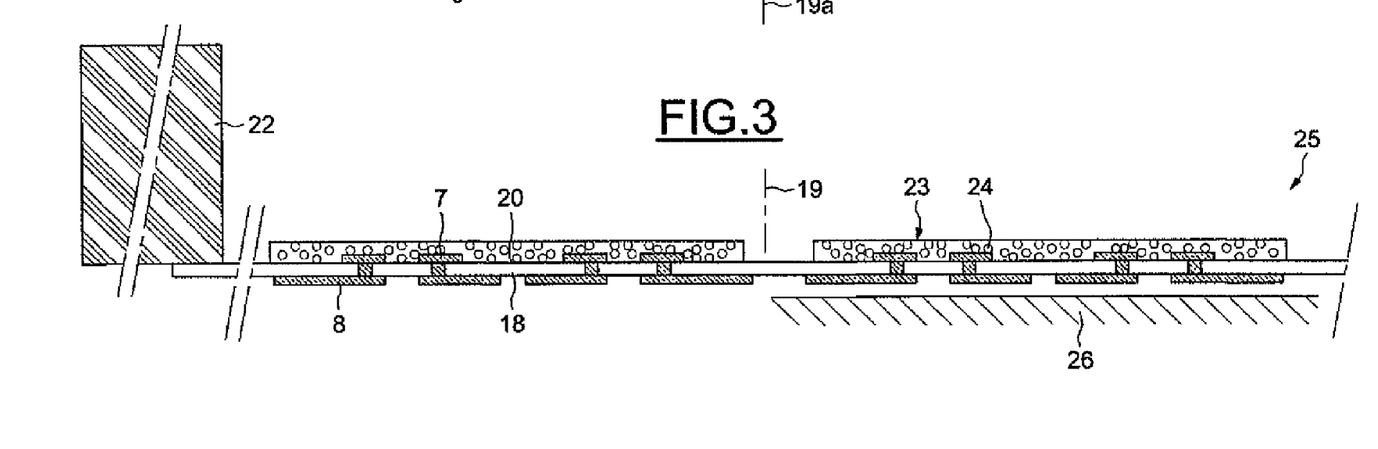
FIG. 3 shows a cross section through a device during a fabrication step.

As illustrated in FIG. 3, the device 16 of FIG. 2 having been fabricated, a step of depositing a layer 23 of a dielectric sealant may be carried out on the front face 20 of the sheet 18, covering the front pads 7, for the purpose of forming, in the locations 19, the intermediate layer 12 of the semiconductor packages 1 to be obtained. The sealing layer 23 contains particles 24 of an electrically conductive material in suspension.

The sealing layer 23 may be deposited by any known means. In particular, in one embodiment, the sealing layer 23, made of a pasty material, may be obtained by screen printing through a mask so as to obtain patches spaced apart, in the respective locations 19 on the front face 20 of the sheet 18. In another embodiment, the sealing layer 23, also made of a pasty material, may be obtained by depositing, on the front face 20 of the sheet 18, a layer formed beforehand on a carrier film, the lamination of this layer, so that it completely covers the front face 20, and the removal of the carrier film.

The above operations may be carried out by the rear face 21 of the sheet 18 of the device 16 being pressed down on a suction table 26.

A device 25 is therefore obtained.

Figure 4:
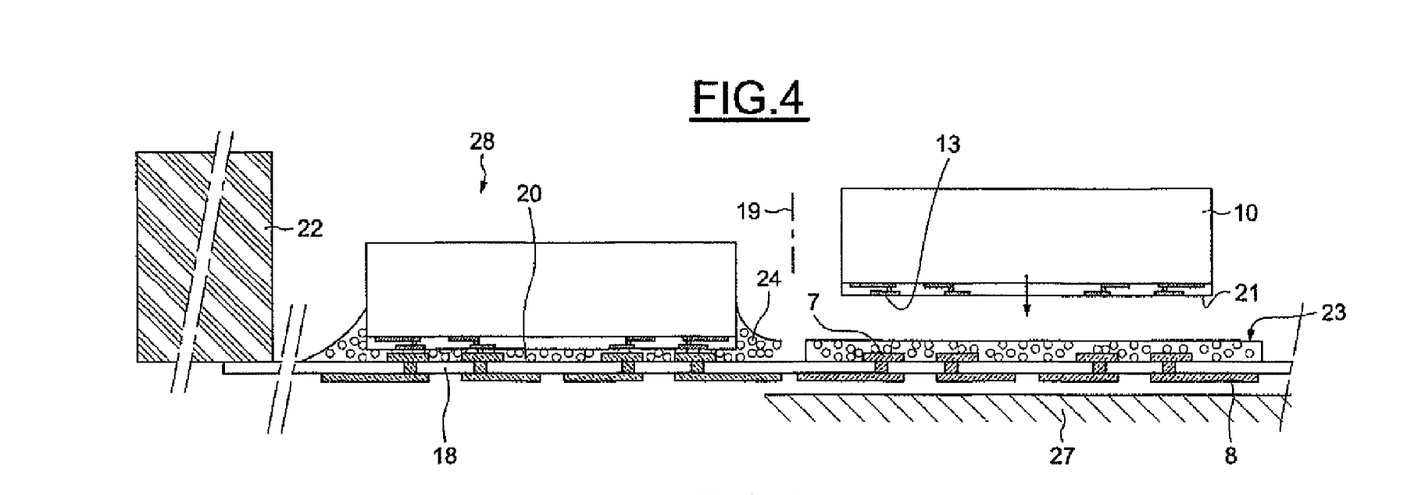
FIG. 4 shows a cross section through a device during a fabrication step.
Figure 8:
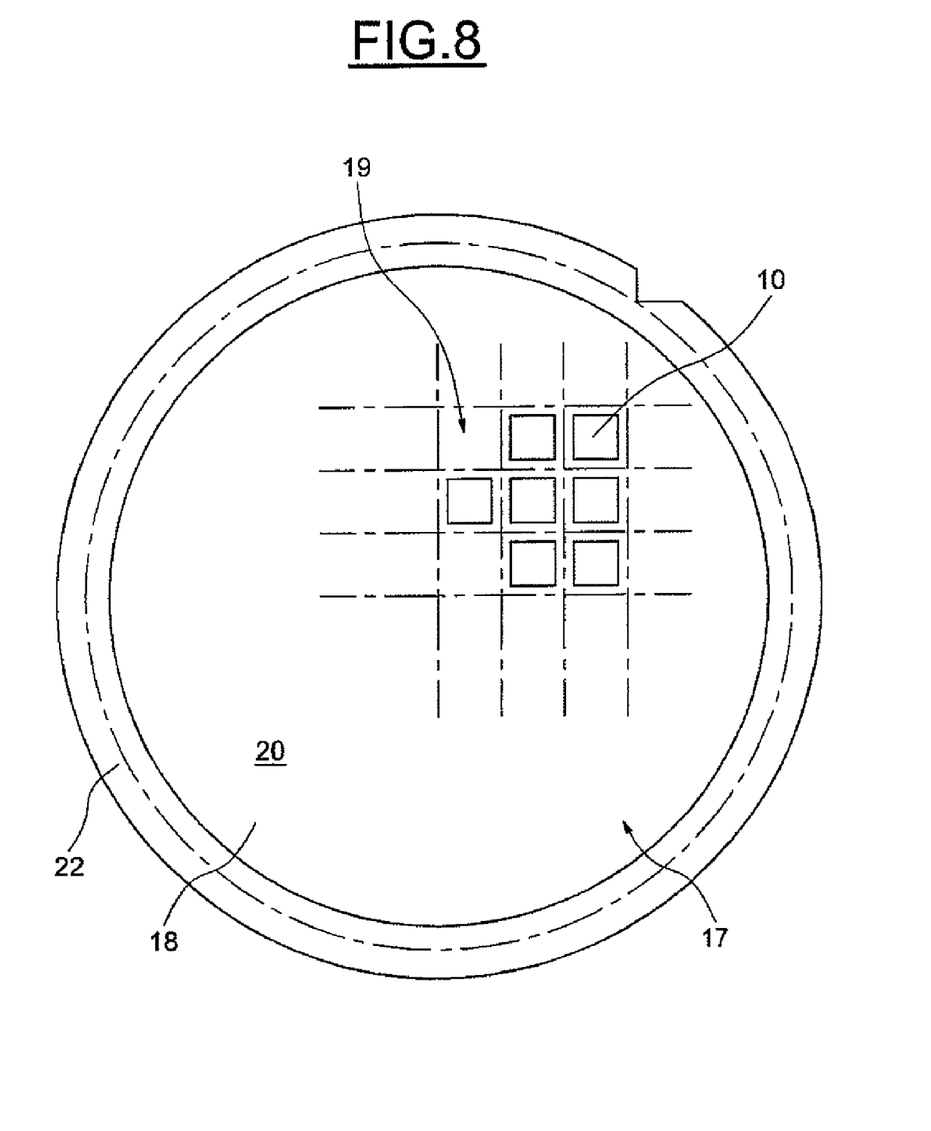
FIG. 8 shows a top view of the device of FIG. 4.

As illustrated in FIGS. 4 and 8, the device 25 from FIG. 3 having been fabricated, a step of positioning a plurality of integrated-circuit chips 10 may be carried out in the respective locations 19, flattening the sealing layer 23, and in positions that are spaced apart in such a way that the pads 13 of the chips 10 are selectively connected electrically to the front pads 7 in the corresponding front locations 19 of the substrate via particles 24 of the sealing layer 23 that lie therebetween.

Since the rear face 21 of the sheet 18 of the device 25 is placed on a suction table 27, the integrated-circuit chips 10 may be positioned one after another, individually or in groups, by means of a pick-and-place head in accordance with the pre-established positions of the front pads 7 or as reference with locating signs fabricated on the front face of the sheet 18.

The sealing layer 23 is then cured, so as to fasten the chips 10.

A device 28 is then obtained.

Figure 5:
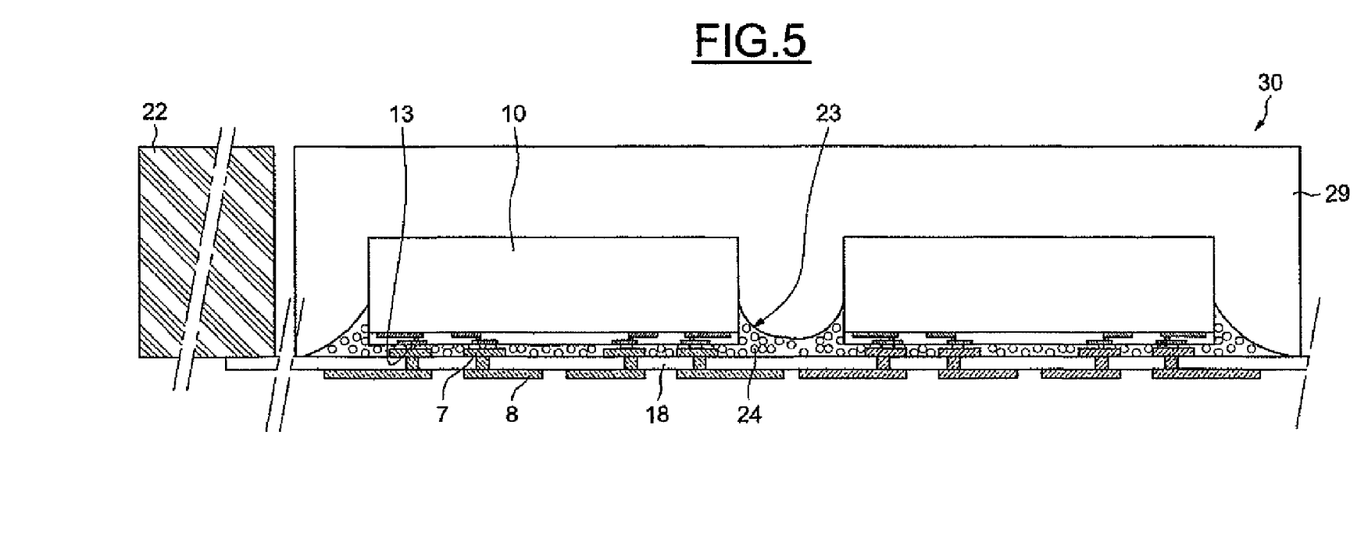
FIG. 5 shows a cross section through a device during a fabrication step.
Figure 9:
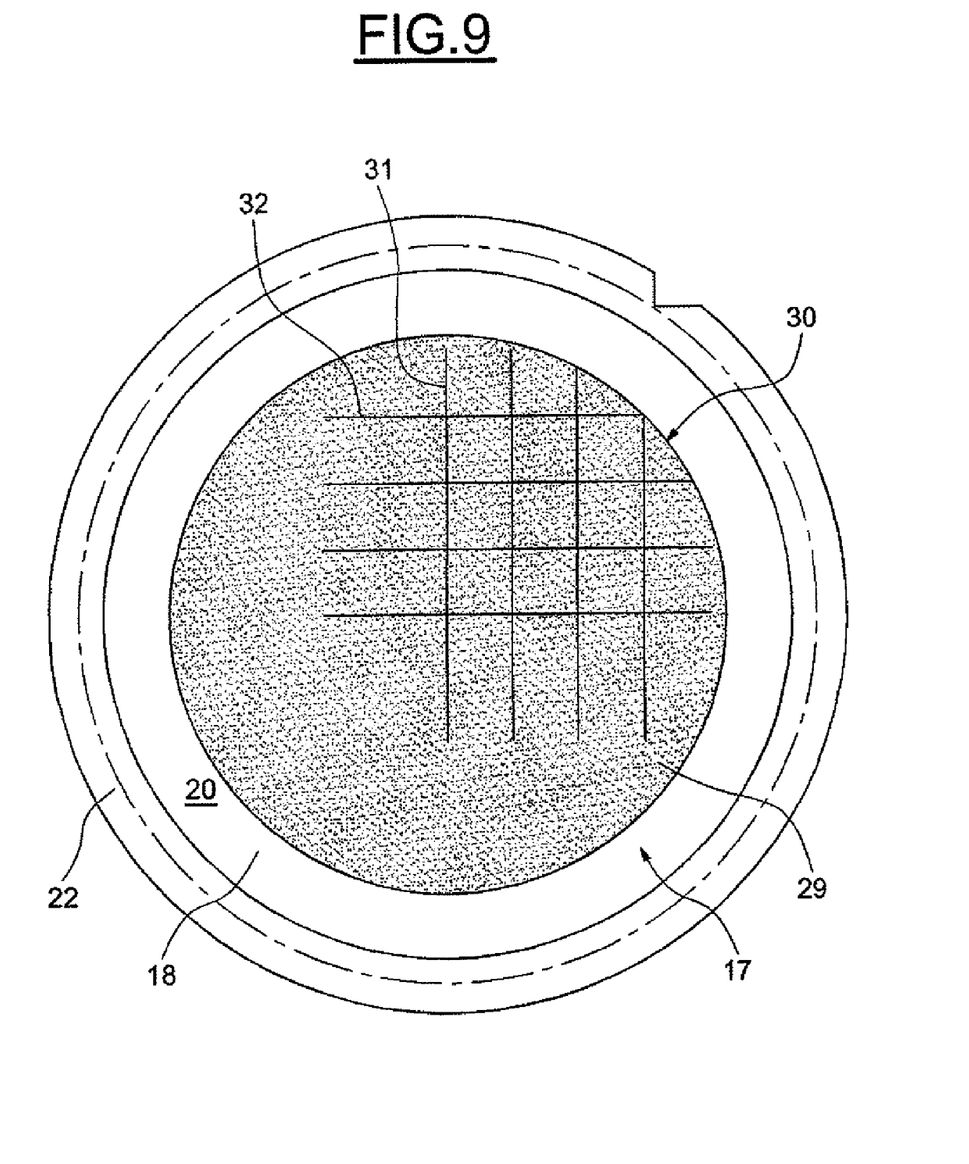
FIG. 9 shows a top view of the device of FIGS. 5 and 6.

As illustrated in FIGS. 5 and 9, the device 28 of FIG. 4 having been fabricated, a step of encapsulating the chips 10 in a block 29 made of a dielectric encapsulation material may be carried out on top of the front face 20 of the sheet 18 of the substrate 17.

The block 29 may be obtained by compression molding. By having a lower portion of a mold with a cup containing the encapsulation material in the liquid or pasty state and by having an upper portion of said mold, against the lower face of which the rear face 21 of the device 25 has been placed, the two parts of the mold are brought together in such a way that the chips 10 penetrate into and are embedded in the encapsulation material, this operation being for example carried out under vacuum.

The encapsulation material is then cured in order to obtain the block 29.

A demolding operation is then carried out so as to obtain a mounted device or assembly 30.

Figure 6:
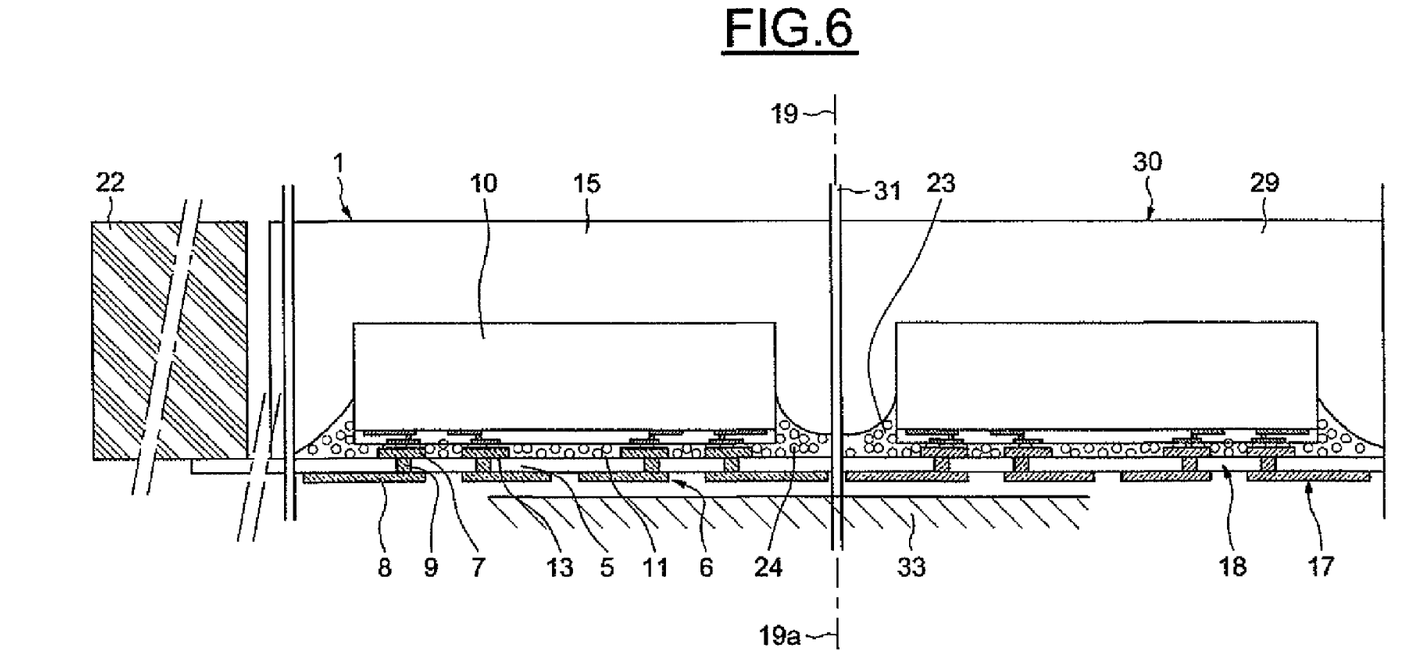
FIG. 6 shows a cross section through a device during a fabrication step.

As illustrated in FIGS. 6 and 9, the mounted assembly 30 may then be diced, in the thickness direction of the sheet 18 of the substrate 17, for example by sawing along longitudinal and transverse lines 31 and 32, corresponding to the lines separating the front and rear locations 19 and 19a, for example having fastened the rear face 21 of the sheet 18 to a table 33 via a double-sided adhesive tape.

What is then obtained, by singulation, is a plurality of semiconductor packages 1 corresponding to the one described with reference to FIG. 1, comprising a portion of the substrate 17, a portion of the sealing layer 23, a chip 10 and a portion of the encapsulation block 29.

In an alternative embodiment, the dicing lines could be arranged so that all or some of the semiconductor packages comprise several integrated-circuit chips embedded in a common encapsulation block.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A process for fabricating semiconductor packages, comprising:

fabricating a substrate provided with a plurality of electrical connection front pads at a plurality of front locations on a front face and a plurality of electrical connection rear pads at a plurality of rear locations on a rear face, the front pads and rear pads being selectively connected via an electrical connection network that passes through said substrate;

mounting a peripheral edge of the substrate on a rigid annular frame;

depositing, on at least said front pads of the substrate, a dielectric sealant layer containing particles made of an electrically conductive material;

positioning integrated-circuit chips on said front locations;

flattening the dielectric sealant layer when positioning such that pads of the integrated-circuit chips are selectively connected electrically to the front pads of the corresponding front locations of the substrate by the particles of the dielectric sealant layer lying therebetween;

encapsulating the integrated-circuit chips in a block of encapsulating material on top of the front face of the substrate so as to constitute a mounted assembly; and dicing the mounted assembly in order to obtain a plurality of semiconductor packages each comprising a portion of the substrate, at least one integrated-circuit chip and a portion of said block of encapsulating material encapsulating the at least one integrated-circuit chip.

2. The process according to claim 1, wherein the substrate comprises a flexible sheet provided with said plurality of electrical connection pads, further comprising fastening a periphery of the flexible sheet to the rigid annular frame.

3. The process according to claim 1, further comprising placing the rear face of the substrate on a suction table, and wherein the steps of depositing, positioning, encapsulating and dicing are carried out while the rear face of the substrate is placed on the suction table.

4. The process according to claim 1, further comprising fabricating the dielectric sealant layer by one of laminating or screen printing the dielectric sealant layer on the front face of the substrate.

5. The process according to claim 1, wherein encapsulating comprises performing a compression molding.

6. The process according to claim 5 wherein the compression molding comprises: immersing the integrated-circuit chips mounted on the substrate in a chamber of a mold containing a curable encapsulation material until the curable encapsulation material encounters the front face of the substrate and/or the dielectric sealant layer.

7. The process according to claim 1, wherein dicing comprises sawing the mounted assembly.

8. A process for fabricating semiconductor packages, comprising:
    mounting a peripheral edge of a substrate on a rigid annular frame;
    depositing a dielectric sealant layer on a front face of the substrate, the dielectric sealant layer containing particles made of an electrically conductive material;
    attaching a plurality of integrated-circuit chips to the front face of the substrate using the dielectric sealant layer, wherein attaching comprises flattening the dielectric sealant layer so as to promote the making of electrical connections between each integrated-circuit chip and the substrate using the contained particles;
    forming an encapsulating block of material over the integrated-circuit chips and the front face of the substrate so as to produce a mounted assembly; and
    dicing the mounted assembly between integrated-circuit chips in order to obtain a plurality of semiconductor packages each comprising a portion of the substrate and at least one integrated-circuit chip.

9. The process according to claim 8, further comprising placing a rear face of the substrate on a suction table, and wherein the steps of depositing, attaching, forming and dicing are carried out while the rear face of the substrate is placed on the suction table.

10. The process according to claim 8, further comprising fabricating the dielectric sealant layer by one of laminating or screen printing the dielectric sealant layer on the front face of the substrate.

11. The process according to claim 8, wherein forming the encapsulating block of material comprises performing a compression molding.

12. The process according to claim 11 wherein compression molding comprises: immersing the integrated-circuit chips mounted on the substrate in a chamber of a mold containing a curable encapsulation material until the curable encapsulation material encounters the front face of the substrate and/or the sealing layer.

13. The process according to claim 8, wherein dicing comprises sawing the mounted assembly.

14. A process for fabricating semiconductor packages, comprising:
    mounting a substrate having a plurality of electrical connection pads to a rigid frame, said pads including front pads on a front face of the substrate;
    depositing a dielectric sealant layer containing particles made of an electrically conductive material on said front pads of the substrate;
    positioning integrated-circuit chips over said front pads;
    selectively electrically connecting pads of the integrated-circuit chips to the front pads through the particles of the dielectric sealant layer lying between the integrated-circuit chips and front pads;
    encapsulating the integrated-circuit chips in an encapsulating material block provided on top of the front face of the substrate so as to form a mounted assembly; and
    dicing the mounted assembly into a plurality of individual semiconductor packages, each package including a portion of the substrate, at least one integrated-circuit chip and a portion of said encapsulating material block.

15. The process according to claim 14, wherein the substrate comprises a flexible sheet.

16. The process according to claim 14, further comprising laminating a sealant on the front face of the substrate to form the dielectric sealant layer.

17. The process according to claim 14, further comprising screen printing a sealant on the front face of the substrate to form the dielectric sealant layer.

* * * * *